United States Patent [19]
Burbidge et al.

[11] Patent Number: 6,094,918
[45] Date of Patent: Aug. 1, 2000

[54] THERMOELECTRIC COOLER CONTROL CIRCUIT

[75] Inventors: Douglas Stephen Burbidge, Kanata; Keith Douglas Anderson, Nepean, both of Canada

[73] Assignee: Nortel Networks Corporation, Montreal, Canada

[21] Appl. No.: 09/152,181

[22] Filed: Sep. 14, 1998

[51] Int. Cl.[7] .................................................. F25B 21/02
[52] U.S. Cl. .............................................. 62/3.7; 62/259.2
[58] Field of Search .................................... 62/3.7, 259.2; 136/203

[56] References Cited

U.S. PATENT DOCUMENTS

| | | | |
|---|---|---|---|
| 4,631,728 | 12/1986 | Simons | 372/38 |
| 5,043,992 | 8/1991 | Royer et al. | 372/38 |
| 5,515,682 | 5/1996 | Nagakubo et al. | 62/3.7 |
| 5,604,758 | 2/1997 | Auyeung et al | 372/34 |
| 5,690,849 | 11/1997 | DeVilbiss et al. | 219/497 |
| 5,704,213 | 1/1998 | Smith et al. | 62/3.7 |

*Primary Examiner*—Henry Bennett
*Assistant Examiner*—Melvin Jones

[57] ABSTRACT

A thermoelectric cooler (TEC) is used to maintain an electronic component, for example, a laser diode, at a set temperature. A thermistor senses the temperature of the laser and through a first control loop causes current to be passed through the TEC so as to adjust the laser temperature. As the temperature of the hot side of the TEC increases above the temperature of the cold side of the TEC, the TEC's cooling efficiency gradually decreases. This is compensated for by adding a second control loop which senses the TEC current and provides an additional gain proportional to the TEC current in the cooling sense. This additional gain is added to the gain provided by the first control loop. The result is a stable, highly responsive temperature controller at all points of the TEC operating range.

25 Claims, 2 Drawing Sheets

THERMOELECTRIC COOLER CONTROL CIRCUIT

FIELD OF THE INVENTION

This invention relates to a control circuit for a thermoelectric cooler particularly but not exclusively for maintaining a laser diode at a predetermined operating temperature.

BACKGROUND OF THE INVENTION

Thermoelectric heat pumps are widely used to maintain a constant temperature of operation for optoelectronic devices such as semiconductor lasers. Although these devices are true heat pumps which are capable of applying heat or removing heat they are primarily operated in a cooling mode and accordingly are usually known as thermoelectric coolers (TEC's). The TEC is used in conjunction with a temperature sensor the output of which is stabilized by a control loop which drives the TEC. In such a system a change in TEC current will yield a corresponding change in the sensor output. The ratio of sensor output to TEC input forms a part of the overall control loop gain. For maintaining a given cold-side temperature the sensor/TEC response is inversely dependent on the hot-side temperature of the TEC. Because the control loop must be designed to operate over a wide range of hot-side temperatures, it must also be designed to deal with a large range of gains because of the variation in TEC response. The control loop must be designed to be stable for the maximum expected gain, and this leads to slow response times for conditions under which the TEC response is small so that the overall gain is low.

SUMMARY OF THE INVENTION

It is an object of the invention to provide a circuit which compensates for variation in control loop gain as the temperature differential across the TEC varies.

According to the invention this is achieved by a process for controlling a thermoelectric cooler (TEC) to maintain an electronic component at a target temperature, in which the differential response of the TEC to current passing through the TEC in a cooling direction decreases as the current increases, the process comprising: sensing the actual temperature of the electronic component; comparing the actual temperature with the target temperature; deriving an electric current according to a predetermined gain, the electric current having a magnitude at least approximately proportional to the difference between the actual temperature and the target temperature; varying the predetermined gain at least approximately in inverse proportion to the differential TEC response $\delta T_C/\delta I_{TEC}$ where $T_C$ represents the sensed temperature of the electronic component and $I_{TEC}$ represents the derived electric current; and passing the electric current through the TEC thereby to reduce the difference between the actual temperature and the target temperature.

According to another aspect, the invention provides a control circuit for maintaining an electronic component at a target temperature comprising a first control loop and a second control loop; the first control loop comprising: a temperature setting device for setting a target temperature; a temperature sensing device for sensing the actual temperature of the electronic component; a circuit having a predetermined gain and deriving an electric current having a magnitude at least approximately proportional to the difference between the actual temperature and the target temperature and a sign which depends on whether the actual value exceeds the target value or vice versa; and a thermoelectric cooler (TEC) receiving the electric current thereby to reduce the difference between the actual temperature and the target temperature, the TEC having an differential cooling response which decreases as current passing therethrough in a cooling direction increases; the second control loop comprising: a device sensing the magnitude of the electric current received by the TEC; and an amplifier circuit connected between the current sensing device and the first control loop thereby to vary the predetermined gain of the first control loop by an amount that is at least approximately inversely proportional to the differential TEC response $\delta T_C/\delta I_{TEC}$ where $T_C$ represents the actual temperature of the electronic component and $I_{TEC}$ represents the current passing through the TEC.

By using gain compensation the response time of the temperature control loop can be improved while the stability of the temperature control loop over a large range of gain is maintained.

Because the TEC response is approximately inversely proportional to the TEC current, an analog gain compensation can be implemented which is simpler and less expensive than using some sort of microprocessor controlled compensation.

Because the TEC current is already a required signal in any TEC control loop, there is no need to add any extra sensors or signals to effect compensation.

BRIEF DESCRIPTION OF THE DRAWINGS

Preferred embodiments of this invention will now be described with reference to the attached drawings in which.

DETAILED DESCRIPTION OF THE PREFERRED EMBODIMENT

Figure 1:
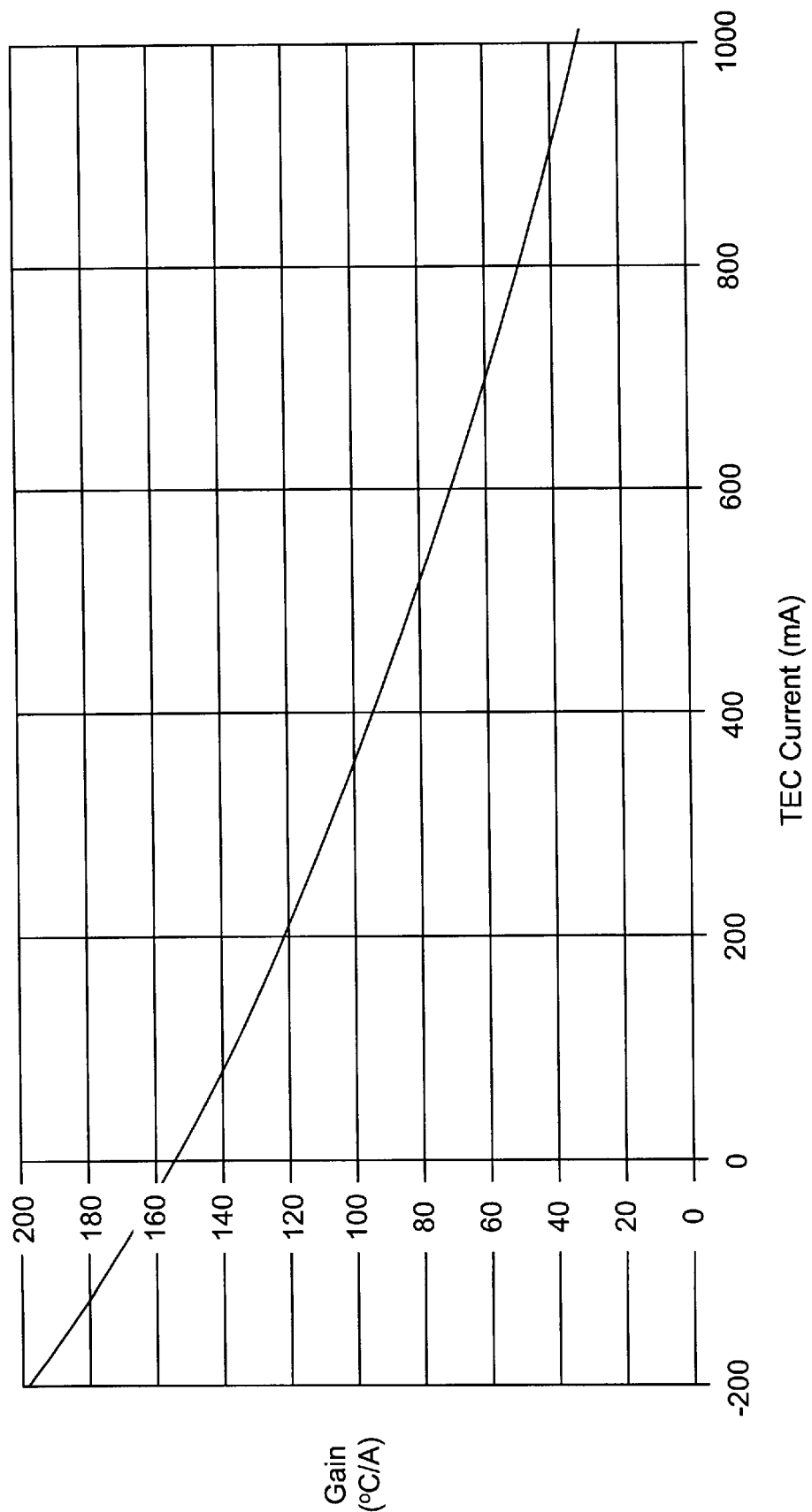
FIG. 1 is a graph showing the relationship between the gain or response of a TEC in relation to the TEC current.

Referring firstly to FIG. 1, this shows a typical response curve for a TEC/thermistor temperature control combination used for cooling a semiconductor laser.

By way of explanation, assume that for a typical operating point the TEC current required to pump enough heat from the cold side (adjacent the laser and thermistor) to the hot side (adjacent the outside of the casing) of the TEC to hold the cold side 40 degrees Celsius below the hot side is 500 mA. From the graph it can be seen that this corresponds to a differential gain or response of 80° C./A. What this means is that it would require an additional 12.5 mA (1/80) to increase the temperature difference ($\delta T$) between the cold and hot sides by 1 degree.

Supposing the hot side temperature increases considerably and it is desired to maintain the cold side temperature constant, the amount of current that has to be fed to the TEC to cause this increased amount of heat to be pumped away has to be increased greatly. Supposing the value of the TEC current to achieve this is 800 mA. It can be seen that this corresponds to 50° C./A which translates to an additional 20 mA to vary the temperature difference between the hot and cold sides by 1 degree. Thus, as the TEC is caused to work harder its cooling efficiency drops off.

The graph of FIG. 1 can be expressed in the form $$\text{Gain} = \frac{\delta T_c}{\delta I_{TEC}} = \frac{\frac{\alpha\rho(I_{TEC})^2}{2\Gamma} + \rho I_{TEC}\kappa - \alpha\left(\frac{Q_C}{2N} - \kappa T_h \Gamma\right)}{(\alpha I_{TEC} + \kappa\Gamma)^2}$$

where

α is the Seebeck coefficient,
$I_{TEC}$ is the current applied to the TEC,
κ is the thermal conductivity of the TEC elements,
Γ is a factor describing the geometry of the TEC elements,
$Q_c$ is the net heat pumped,
$T_c$ is the constant temperature being controlled,
$T_h$ is the hot side temperature,
ρ is the electrical resistivity of the TEC elements,
N is the number of Peltier couples in the TEC.

By considering the curve in FIG. 1 as linear, the TEC gain or response is $\delta T_c/\delta I_{TEC}$ can be described approximately by Gain=160−130$I_{TEC}$.

Figure 2:
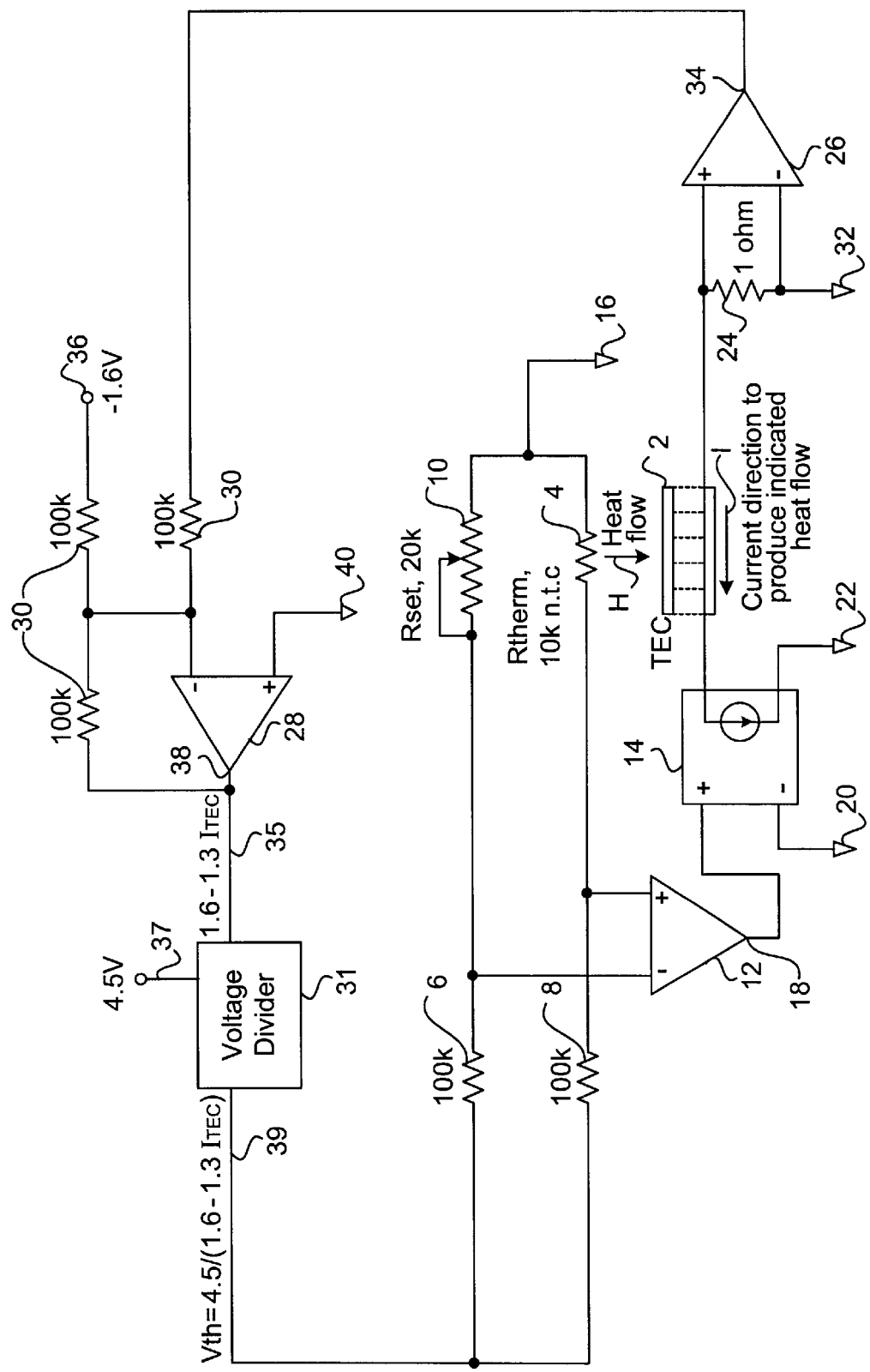
FIG. 2 is a circuit diagram illustrating a TEC control circuit according to the invention.

The circuit illustrated in FIG. 2 is a control circuit which compensates for this drop off in gain. Referring to that Figure, a first (or inner) control loop comprises a TEC 2, a temperature sensor in the form of a thermistor 4, a fixed resistor 8 which forms a voltage divider with the thermistor 4, a variable voltage divider comprising a fixed resistor 6 and a variable resistor 10, a differential amplifier 12 and a voltage controlled current source 14.

The TEC 2 is mounted between a heat sink (not shown) and a laser diode (not shown) with the thermistor 4 in close proximity to the laser diode. The thermistor 4 may have a positive or negative temperature coefficient with the circuit configuration updated correspondingly. The example chosen is a nominal 10K ohm device with a negative temperature coefficient of approximately −350 ohm/° C.

One side of the thermistor 4 is connected to one side of the variable resistor 10, which in this example is variable up to 20K ohm, and this junction is grounded at 16. The other side of thermistor 4 is connected to the non-inverting input of differential amplifier 12 and the other side of variable resistor 10 is connected to the inverting input of differential amplifier 12. The two fixed resistors 6 and 8, each being 100K ohm in the example chosen, are joined together at one side, with the other side of resistor 6 being connected to the inverting input of differential amplifier 12 and the other side of resistor 8 being connected to the non-inverting input of differential amplifier 12. The joined sides of resistors 6 and 8 are connected to a voltage source forming part of a second control loop as will be described below. It should be apparent that the output of differential amplifier 12 will be 0 when the thermistor resistance equals the variable resistance $R_{set}$ which is adjusted in order to set the target temperature of the laser and thermistor.

The gain of the differential amplifier 12 is 50 and the gain of the stage depends on the voltage Vth of the voltage source and is approximately Vth/2200 ohm.

The output 18 of the differential amplifier 12 is connected to a positive voltage input of the voltage controlled current source 14 the negative voltage input of which is connected to ground at 20. The current side of the voltage controlled current source 14 is connected between ground at 22 and the TEC. The current direction through TEC 2 to produce the heat flow indicated by arrow H is indicated by arrow I. The DC gain of the voltage controlled current source is adjustable to provide an output between limits of +1 A and −0.2 A. Typically the gain would be set to about 3.6 A/V to give an overall static gain of about 400 to the first or inner control loop. It should be apparent that current that is passed through the TEC is approximately proportional to the difference between the actual cold side temperature of the TEC (and thermistor 4) and the target temperature. In fact, there is no requirement that the current be linearly proportional to the difference between the target and actual temperatures. In practice, in the region of primary interest which is for small perturbations of the temperature from the target during active control, the relationship will be approximately linear.

Using the approximation mentioned above the gain of the TEC=160−130$I_{TEC}$. The thermistor gain is 350. The gain of the circuit comprising the resistors 6,8,10, thermistor 4, TEC 2, differential amplifier 12 and voltage controlled current source 14 is Vth×Diff. Amp Gain×Current Source Gain/110

=Vth×50×3.6/110

=1.64×10$^{-3}$Vth

Thus, the overall loop gain is

G=thermistor gain×TEC gain×circuit gain

=350×(160−130$I_{TEC}$)×1.64×10$^{-3}$×Vth

If we set the maximum value of Vth for practical reasons to be 15, the equivalent value for $I_{TEC}$ is 1 amp and this gives

G=350×(160−130)×1.64×10$^{-3}$×15

=258

We want to maintain the same overall loop gain for all values of $I_{TEC}$ so that we require Vth=258/(350×(160−130$I_{TEC}$)×1.64×10$^{-3}$)

=4.5/(1.6−1.3$I_{TEC}$)

Thus to provide the necessary gain compensation we have to provide a second or other control loop which provides Vth approximately according to the equation Vth=4.5/(1.6−1.3$I_{TEC}$)

Of course if we set the maximum value of Vth to a different value we will arrive at a gain different from 258. Thus, in the general sense Vth=A/(1.6−1.3$I_{TEC}$)

where A is a constant.

The outer control loops consists of a 1 ohm resistor 24, a differential amplifier 26, a further differential amplifier 28, three 100 k ohm resistors 30 and a voltage divider 31.

More particularly, the resistor 24 is connected between the TEC 2 and ground at 32 and is also connected across the two inputs of amplifier 26 which has a gain of −1.3, for example. This produces an output voltage 34 of −1.3 times the TEC current where positive TEC current is in the direction of the arrow 1. As indicated previously the current limits from current source 14 are +1A (in the cooling direction) and −0.2A (in the heating direction) providing a range for output voltage 34 of −1.3 V to −1.6 V.

The output 34 of the differential amplifier 26 is connected through one of the resistors 30 to the inverting input of differential amplifier 28. A second one of the resistors 30 is connected between a −1.6 volt source 36 and the inverting input and the last resistor 30 is connected between the inverting input and the output 38 of differential amplifier 28.

The non-inverting input of differential amplifier 28 is connected to ground at 40. It can be appreciated that differential amplifier 28 and the resistors 30 act as a summing circuit to add a 1.6 volt offset such that Vth produced at the output 38 of differential amplifier 28 provides a voltage equal to 1.6−1.3$I_{TEC}$. Now, referring to FIG. 1, a reasonable linear approximation to the gain curve shown is 160−130$I_{TEC}$. It can be appreciated that the voltage at output 28 is roughly one hundredth of this value. In order to compensate for the gain change illustrated in FIG. 1 it is, therefor, necessary to create an inverse function. Hence, output 28 is connected to a denominator input 35 of the voltage divider 31 which has a numerator input of 37 connected to a 4.5 V voltage source, the voltage divider 31 has an output 39 which is connected to Vth. Thus Vth equals 4.5/(1.6−13$I_{TEC}$)volts.

It should be apparent that, while the gain of the specific TEC being considered approximates to 160−130$I_{TEC}$, the gain of any TEC may be expressed as B−C$I_{TEC}$ where B and C are constants.

Thus, the general equation for $V_{th}$ may be expressed:

$$V_{th} = A/(B-CI_{TEC}).$$

Numerous modification and variations to the present invention are possible in the light of the above teachings. It is therefore to be understood that within the scope of the appended claims the invention may be practised otherwise as specifically described.

Specifically, alternative analog or digital methods of adjusting the gain of the control loop are within the scope of the invention. For example, because the current sensing resistor 24 is power hungry at high current an alternative way of deriving a useful feedback signal is to use the voltage across the TEC itself. A further alternative would be to use the control voltage which drives the current source 14 as the feedback voltage. Yet another alternative would be the use of a reactive current sensing element instead of a resistor which could be feasible if the current produced by the current source 14 were produced in width modulated pulses.

Because the TEC response is approximately proportional to the TEC current the present invention permits analog gain compensation to be implemented easily without the use of a microprocessor. However, it should be appreciated that the compensation provided by the present invention could also be implemented in software by replacing the second control loop with a look up table, for example, which relates gain compensation to $I_{TEC}$ and a microprocessor which adjusts the gain of the first control loop on the basis of the $I_{TEC}$.

What is claimed is:

1. A process for controlling a thermoelectric cooler (TEC) to maintain an electronic component at a target temperature, in which the differential response of the TEC to current passing through the TEC in a cooling direction takes the form $\delta T_C/\delta I_{TEC} = B - CI_{TEC}$
where
   $T_C$ is the temperature being controlled
   $I_{TEC}$ is the current applied to the TEC
   B and C are constants,
the process comprising:
   sensing the actual temperature of the electronic component;
   comparing the actual temperature with the target temperature;
   deriving an electric current according to a predetermined gain, the electric current having a magnitude at least approximately proportional to the difference between the actual temperature and the target temperature;
   varying the predetermined gain at least approximately according to the form A/(B−C$I_{TEC}$) where A is a constant; and
   passing the electric current through the TEC thereby to reduce the difference between the actual temperature and the target temperature.

2. A process according to claim 1, wherein the step of varying the predetermined gain comprises passing the electric current through a current sensing resistor thereby deriving a voltage which is used to vary the predetermined gain.

3. A process according to claim 1, wherein the step of varying the predetermined gain comprises sensing the voltage of the TEC and using that voltage to vary the predetermined gain.

4. A process according to claim 1, wherein the step of passing the electric current through the TEC involves passing width modulated pulses of electric current through the TEC and the step of varying the predetermined gain comprises passing the pulses through a reactor thereby deriving a voltage which is used to vary the predetermined gain.

5. A process according to claim 1, wherein the step of varying the predetermined gain comprises a microprocessor connecting a look up table relating gain compensation to magnitude of electric current through the TEC and varying the predetermined gain on the basis of the gain compensation corresponding to the magnitude of the electric current.

6. A process according to claim 1, wherein the response of the TEC to current passing through the TEC takes the form of $$\text{Gain} = \frac{\delta T_c}{\delta I_{TEC}} = \frac{\frac{\alpha\rho(I_{TEC})^2}{2\Gamma} + \rho I_{TEC}\kappa - \alpha\left(\frac{Q_c}{2N} - \kappa T_h\Gamma\right)}{(\alpha I_{TEC} + \kappa\Gamma)^2}$$

where
   α is the Seebeck coefficient,
   $I_{TEC}$ is the current applied to the TEC,
   κ is the thermal conductivity of the TEC elements,
   Γ is a factor describing the geometry of the TEC elements,
   $Q_C$ is the net heat pumped,
   $T_C$ is the constant temperature being controlled,
   $T_h$ is the hot side temperature,
   ρ is the electrical resistivity of the TEC elements,
   N is the number of Peltier couples in TEC.

7. A control circuit for maintaining an electronic component at a target temperature comprising a first control loop and a second control loop;
   the first control loop comprising:
   a variable resistor serving as a temperature setting device for setting a target temperature;
   a thermistor serving as a temperature sensing device for sensing the actual temperature of the electronic component;
   a circuit having a predetermined gain and deriving an electric current having a magnitude at least approximately proportional to the difference between the actual temperature and the target temperature and a sign which depends on whether the actual value exceeds the target value or vice versa; and
   a thermoelectric cooler (TEC) receiving the electric current thereby to reduce the difference between the actual temperature and the target temperature, the TEC having an differential cooling response which decreases as current passing therethrough in a cooling direction increases;

the second control loop comprising:
  a device sensing the magnitude of the electric current received by the TEC; and
  an amplifier circuit connected between the current sensing device and the first control loop thereby to vary the predetermined gain of the first control loop by an amount that is at least approximately inversely proportional to the differential TEC response $\delta T_C/\delta I_{TEC}$ where $T_C$ represents the actual temperature of the electronic component and $I_{TEC}$ represents the current passing through the TEC.

8. A control circuit according to claim 7, wherein the circuit deriving an electric current having a magnitude at least approximately proportional to the difference between the actual temperature and the target temperature comprises a first differential amplifier having inputs respectively fed by the thermistor and the variable resistor and a voltage controlled current source connected to an output of the first differential amplifier.

9. A control circuit according to claim 8, wherein the current sensing device is a resistor and the amplifier circuit includes a second differential amplifier having inputs connected across the resistor.

10. A control circuit according to claim 8, wherein the current sensing device is circuit means connected across the TEC to sense the voltage across the TEC and the amplifier circuit includes a second differential amplifier having inputs connected to the circuit means.

11. A control circuit according to claim 8, wherein the voltage controlled current source produces width modulated current pulses, the current sensing device is a reactor and the amplifier circuit includes a second differential amplifier having inputs connected across the reactor.

12. A control circuit according to claim 7, wherein the current sensing device is a resistor and the amplifier circuit includes a second differential amplifier having inputs connected across the resistor.

13. A control circuit according to claim 12, wherein an output of the second differential amplifier is connected through an offset summing circuit and voltage divider to the first control loop.

14. A control circuit according to claim 7, wherein the current sensing device is circuit means connected across the TEC to sense the voltage across the TEC and the amplifier circuit includes a second differential amplifier having inputs connected to the circuit means.

15. A control circuit according to claim 14, wherein an output of the second differential amplifier is connected through an offset summing circuit and voltage divider to the first control loop.

16. A control circuit according to claim 7, wherein the voltage controlled current source produces width modulated current pulses, the current sensing device is a reactor and the amplifier circuit includes a second differential amplifier having inputs connected across the reactor.

17. A control circuit according to claim 16, wherein an output of the second differential amplifier is connected through an offset summing circuit and voltage divider to the first control loop.

18. A control circuit for maintaining an electronic component at a target temperature comprising a first control loop having a gain and a second control loop having a gain;
  the first control loop comprising:
    a variable resistor serving as a temperature setting device for setting a first voltage corresponding to the target temperature;
    a thermistor serving as a temperature setting device and deriving a second voltage dependent on the actual temperature, the thermistor and the variable resistor forming part of thermistor bridge;
    a first differential amplifier having two inputs connected respectively to the temperature setting device and the thermistor to apply to the first differential amplifier a voltage dependent on the difference between the first and second voltages;
    a voltage controlled current source connected to an output of the first differential amplifier and supplying driving current; and
    a thermoelectric cooler (TEC) connected in heat transfer relationship with the electronic device and connected electrically to the voltage controlled current source to receive the driving current, the TEC having a differential cooling response which decreases as current passing therethrough increases;
  the second control loop comprising:
    a current sensing device sensing the driving current through the TEC and deriving a voltage proportional to that current; and
    an amplifier circuit connected between the current sensing device and the inputs of the first differential amplifier to provide a variable supply voltage for the thermistor bridge, whereby the gain of the first control loop is varied according to the TEC current sensed by the current sensing device thereby compensating for the varying response of the TEC.

19. A control circuit according to claim 18, wherein the variable supply voltage is approximately equal to $A/(B-CI_{TEC})$ where A, B and C are constants and $I_{TEC}$ is the TEC current.

20. A control circuit according to claim 19, wherein the amplifier circuit of the second control loop comprises a second differential amplifier having inputs connected to the current sensing device, an offset summing device connected to an output of the second differential amplifier and a voltage divider connected between an output of the offset summing device and the thermistor bridge.

21. A process for controlling a thermoelectric cooler (TEC) to maintain an electronic component at a target temperature, in which the differential response of the TEC to current passing through the TEC in a cooling direction takes the form $$\frac{\delta T_c}{\delta I_{TEC}} = \frac{\frac{\alpha\rho(I_{TEC})^2}{2\Gamma} + \rho I_{TEC}\kappa - \alpha\left(\frac{Q_C}{2N} - \kappa T_h\Gamma\right)}{(\alpha I_{TEC} + \kappa\Gamma)^2}$$

where
  $\alpha$ is the Seebeck coefficient,
  $I_{TEC}$ is the current applied to the TEC,
  $\kappa$ is the thermal conductivity of the TEC elements,
  $\sigma$ is a factor describing the geometry of the TEC elements,
  $Q_C$ is the net heat pumped,
  $T_C$ is the constant temperature being controlled,
  $T_h$ is the hot side temperature,
  $\rho$ is the electrical resistivity of the TEC elements,
  N is the number of Peltier couples in TEC,
  the process comprising:
    sensing the actual temperature of the electronic component;
    comparing the actual temperature with the target temperature;

deriving an electric current according to a predetermined gain, the electric current having a magnitude at least approximately proportional to the difference between the actual temperature and the target temperature;

varying the predetermined gain at least approximately in inverse proportion to the differential TEC response; and passing the electric current through the TEC thereby to reduce the difference between the actual temperature and the target temperature.

22. A process according to claim 21, wherein the step of varying the predetermined gain comprises passing the electric current through a current sensing resistor thereby deriving a voltage which is used to vary the predetermined gain.

23. A process according to claim 21, wherein the step of varying the predetermined gain comprises sensing the voltage of the TEC and using that voltage to vary the predetermined gain.

24. A process according to claim 21, wherein the step of passing the electric current through the TEC involves passing width modulated pulses of electric current through the TEC and the step of varying the predetermined gain comprises passing the pulses through a reactor thereby deriving a voltage which is used to vary the predetermined gain.

25. A process according to claim 21, wherein the step of varying the predetermined gain comprises a microprocessor connecting a look up table relating gain compensation to magnitude of electric current through the TEC and varying the predetermined gain on the basis of the gain compensation corresponding to the magnitude of the electric current.

* * * * *

UNITED STATES PATENT AND TRADEMARK OFFICE
CERTIFICATE OF CORRECTION

PATENT NO. : 6,094,918
DATED : August 1, 2000
INVENTOR(S) : Douglas S. Burbidge et al.

It is certified that error appears in the above-identified patent and that said Letters Patent is hereby corrected as shown below:

Column 8,
Line 55, (claim 21): change "σ" to "Γ"

Signed and Sealed this

Eighteenth Day of September, 2001

Attest:

*Nicholas P. Godici*

NICHOLAS P. GODICI
*Attesting Officer*  *Acting Director of the United States Patent and Trademark Office*